United States Patent
Chen

(10) Patent No.: US 9,472,286 B2
(45) Date of Patent: *Oct. 18, 2016

(54) WORD LINE REPAIR FOR 3D VERTICAL CHANNEL MEMORY

(71) Applicant: MACRONIX INTERNATIONAL CO., LTD., Hsinchu (TW)

(72) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/949,650

(22) Filed: Nov. 23, 2015

(65) Prior Publication Data

US 2016/0078944 A1  Mar. 17, 2016

Related U.S. Application Data

(63) Continuation of application No. 14/486,988, filed on Sep. 15, 2014, now Pat. No. 9,224,473.

(51) Int. Cl.
*G11C 29/44* (2006.01)
*G11C 11/418* (2006.01)
(Continued)

(52) U.S. Cl.
CPC ............ *G11C 16/08* (2013.01); *G11C 8/14* (2013.01); *G11C 16/0466* (2013.01);
(Continued)

(58) Field of Classification Search
CPC ... G11C 11/418; G11C 29/44; G11C 29/789; G11C 5/02; G11C 5/025; G11C 5/06; G11C 2213/71; G11C 13/0023; G11C 8/10
USPC .............................. 365/51, 63, 148, 163, 200
See application file for complete search history.

(56) References Cited

U.S. PATENT DOCUMENTS 6,906,940 B1  6/2005  Lue
7,315,474 B2  1/2008  Lue
(Continued)

FOREIGN PATENT DOCUMENTS

EP  2048709 A2  4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92. (cited in parent application).

(Continued)

*Primary Examiner* — Ly D Pham
(74) *Attorney, Agent, or Firm* — Yiding Wu; Haynes Beffel & Wolfeld LLP

(57) ABSTRACT

A memory device includes a plurality of stacks of conductive strips alternating with insulating strips, including at least a bottom plane of conductive strips, a plurality of intermediate planes of conductive strips, a top plane of conductive strips, and an additional intermediate plane. A plurality of vertical structures is arranged orthogonally to the plurality of stacks. Memory elements are disposed in interface regions at cross-points between side surfaces of the plurality of stacks and the plurality of vertical structures. A stack of linking elements is connected to conductive strips in respective intermediate planes and to the additional intermediate plane. Decoding circuitry is coupled to the plurality of intermediate planes and the additional intermediate plane, and is configured to replace an intermediate plane indicated to be defective with the additional intermediate plane.

10 Claims, 8 Drawing Sheets

(51) Int. Cl.
| | |
|---|---|
| G11C 5/02 | (2006.01) |
| G11C 5/06 | (2006.01) |
| G11C 8/10 | (2006.01) |
| G11C 16/08 | (2006.01) |
| G11C 16/04 | (2006.01) |
| H01L 27/115 | (2006.01) |
| H01L 21/768 | (2006.01) |
| G11C 8/14 | (2006.01) |
| G11C 16/10 | (2006.01) |
| G11C 16/26 | (2006.01) |
| G11C 29/00 | (2006.01) |
| G11C 13/00 | (2006.01) |
| G11C 29/12 | (2006.01) |

(52) U.S. Cl.
CPC .............. *G11C 16/10* (2013.01); *G11C 16/26* (2013.01); *G11C 29/44* (2013.01); *G11C 29/76* (2013.01); *G11C 29/82* (2013.01); *H01L 21/76895* (2013.01); *H01L 27/11565* (2013.01); *H01L 27/11582* (2013.01); *G11C 5/02* (2013.01); *G11C 5/025* (2013.01); *G11C 5/06* (2013.01); *G11C 8/10* (2013.01); *G11C 11/418* (2013.01); *G11C 13/0023* (2013.01); *G11C 29/789* (2013.01); *G11C 2029/1202* (2013.01); *G11C 2213/71* (2013.01)

(56) References Cited

U.S. PATENT DOCUMENTS

| | | | |
|---|---|---|---|
| 7,420,242 | B2 | 9/2008 | Lung |
| 7,696,559 | B2 | 4/2010 | Arai et al. |
| 7,851,849 | B2 | 12/2010 | Kiyotoshi |
| 8,013,383 | B2 | 9/2011 | Kidoh et al. |
| 8,363,476 | B2 | 1/2013 | Lue et al. |
| 8,467,219 | B2 | 6/2013 | Lue |
| 8,503,213 | B2 | 8/2013 | Chen et al. |
| 8,759,899 | B1 | 6/2014 | Lue et al. |
| 9,224,473 | B1 * | 12/2015 | Chen ................. G11C 16/0466 |
| 2005/0280061 | A1 | 12/2005 | Lee |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0007588 | A1 | 1/2011 | Li et al. |
| 2012/0068241 | A1 | 3/2012 | Sakuma et al. |
| 2012/0119283 | A1 | 5/2012 | Lee et al. |
| 2012/0193681 | A1 | 8/2012 | Or-Bach |
| 2012/0299086 | A1 | 11/2012 | Lee |
| 2015/0214239 | A1 | 7/2015 | Rhie |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223. (cited in parent application).
Fukuzumi et al. "Optimal Integration and Characteristics of Vertical Array Devices for Ultra-High Density, Bit-Cost Scalable Flash Memory," IEEE Dec. 2007, pp. 449-452. (cited in parent application).
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4. (cited in parent application).
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4. (cited in parent application).
Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69. (cited in parent application).
Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193. (cited in parent application).
Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages. (cited in parent application).
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137. (cited in parent application).
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187. (cited in parent application).
Kim et al., "Three-Dimensional NAND Flash Architecture Design Based on Single-Crystalline Stacked Array," IEEE Transactions on Electron Devices, vol. 59, No. 1, pp. 35-45, Jan. 2012. (cited in parent application).
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189. (cited in parent application).
Kim et al., "Novel 3-D Structure for Ultra High Density Flash Memory with VRAT (Vertical-Recess-Array-Transistor) and PIPE (Planarized Integration on the the same PlanE)," IEEE 2008 Symposium on VLSI Technology Digest of Technical Papers, Jun. 17-19, 2008, pp. 122-123. (cited in parent application).
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4. (cited in parent application).
Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010. (cited in parent application).
Nowak et al., "Intrinsic fluctuations in Vertical NAND flash memories," 2012 Symposium on VLSI Technology, Digest of Technical Papers, pp. 21-22, Jun. 12-14, 2012. (cited in parent application).
Tanaka H., et al., "Bit Cost Scalable Technolgy with Punch and Plug Process for Ultra High Density Flash Memory," 2007 Symp. VLSI Tech., Digest of Tech. Papers, pp. 14-15. (cited in parent application).
U.S. Appl. No. 14/284,306, filed May 21, 2014, 60 pages. (cited in parent application).
Wang, Michael, "Technology Trends on 3D-NAND Flash Storage", Impact 2011, Taipei, dated Oct. 20, 2011, found at www.impact.org.tw/2011/Files/NewsFile/201111110190.pdf. (cited in parent application).

* cited by examiner

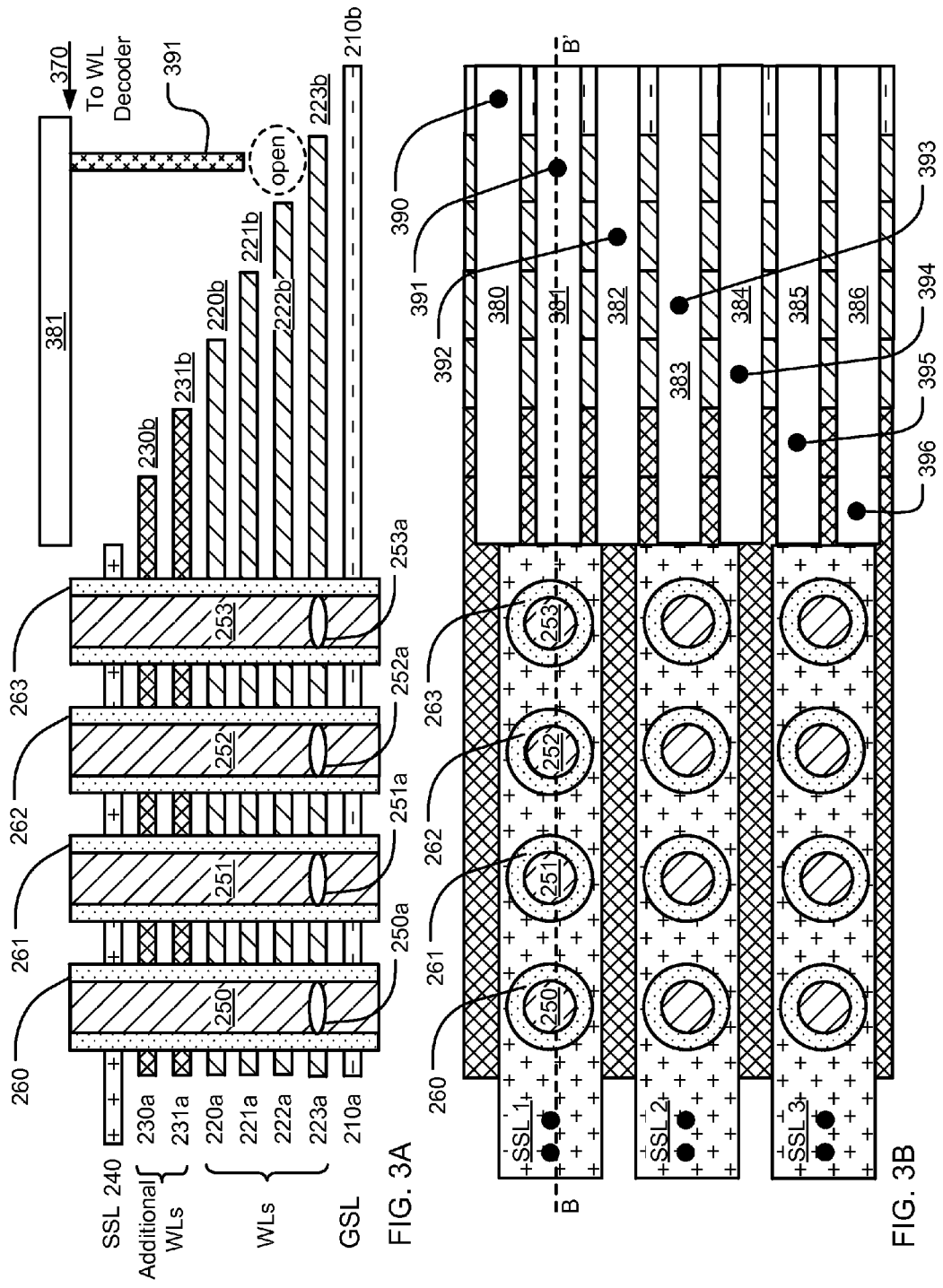

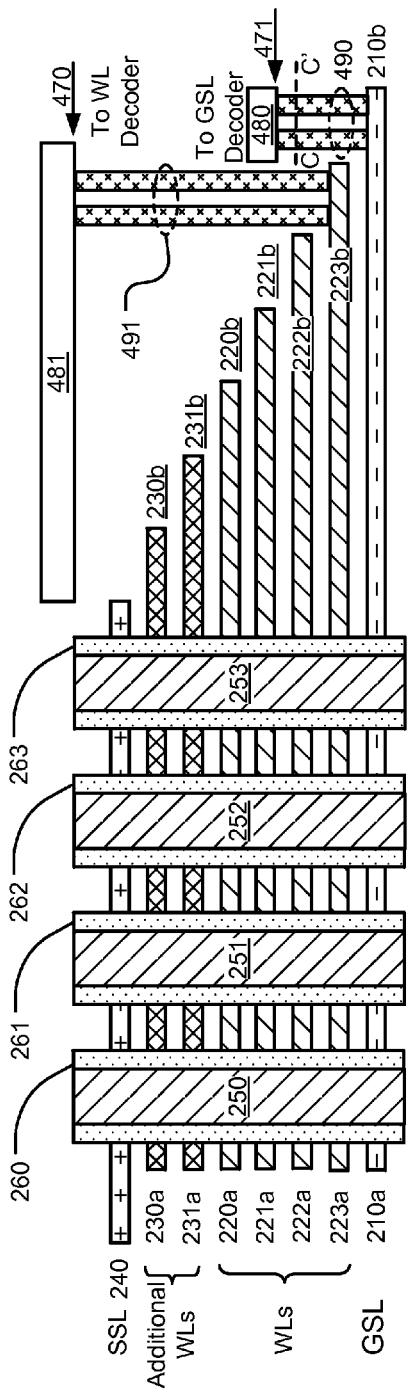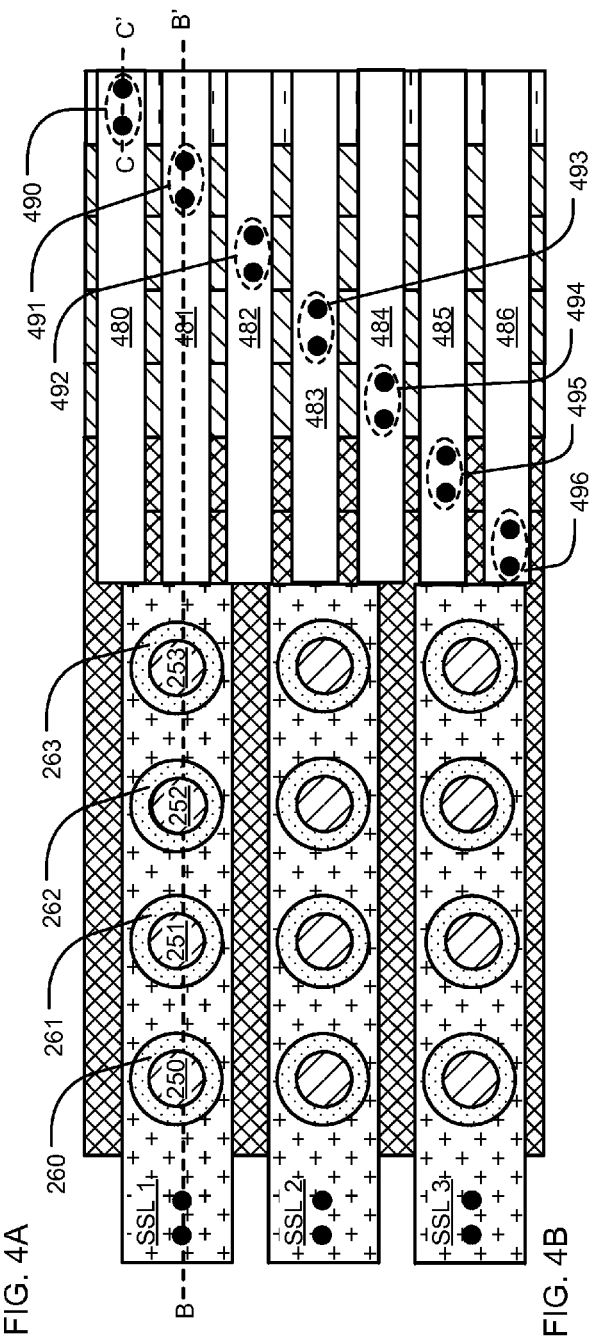

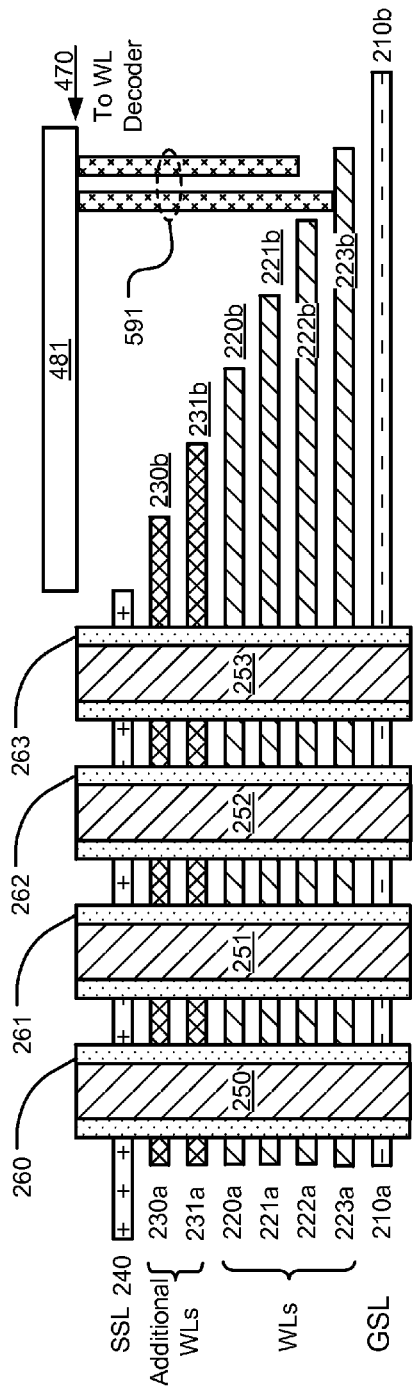
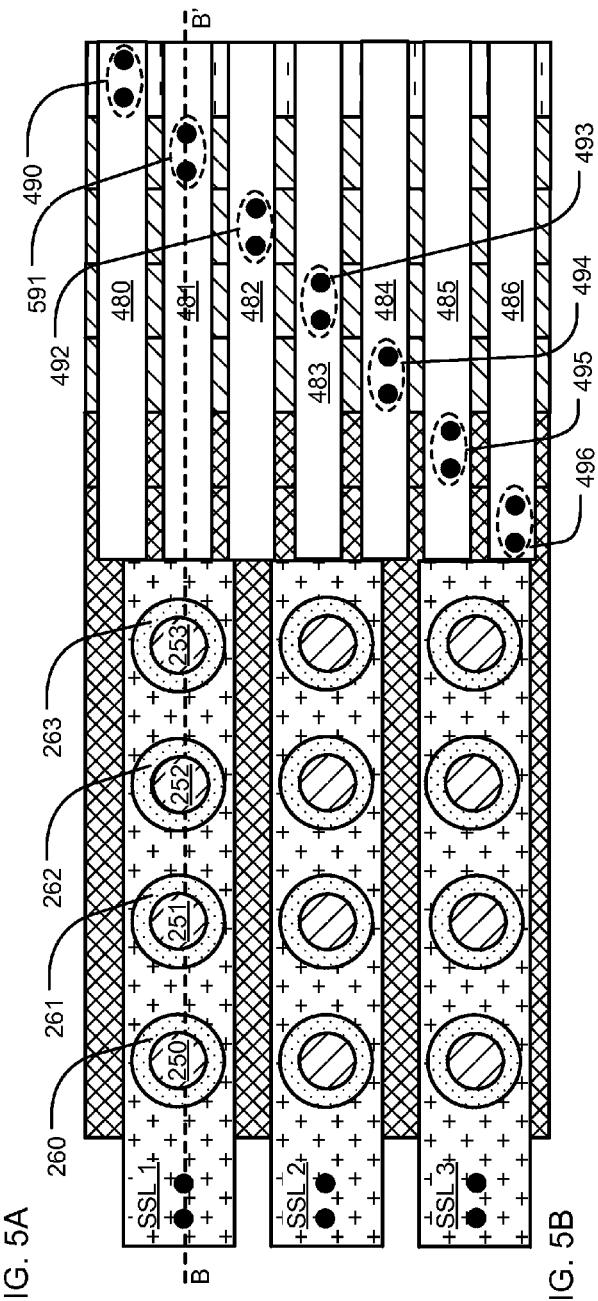
FIG. 5A
FIG. 5B

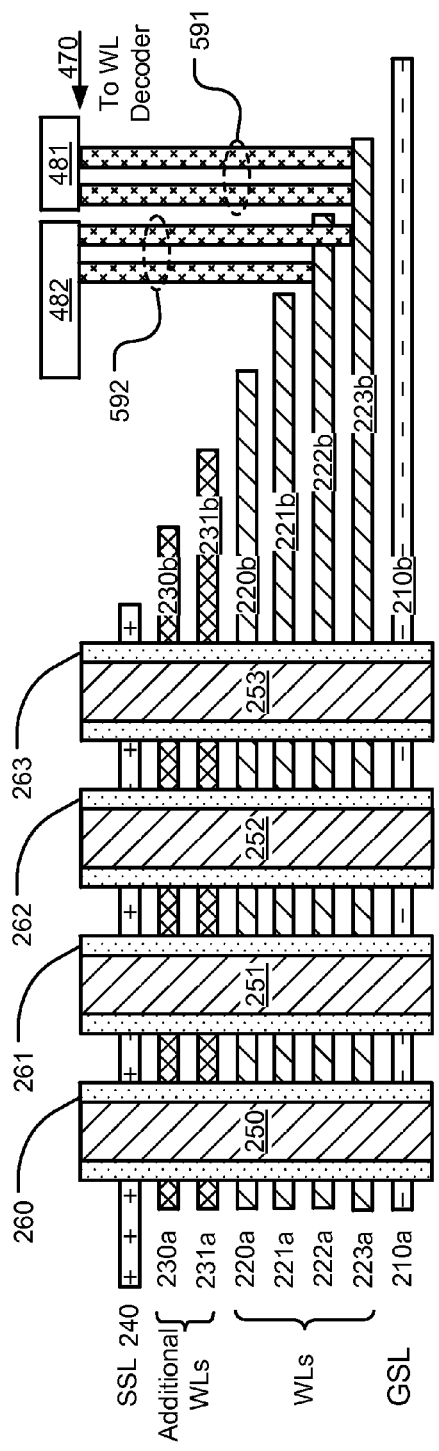
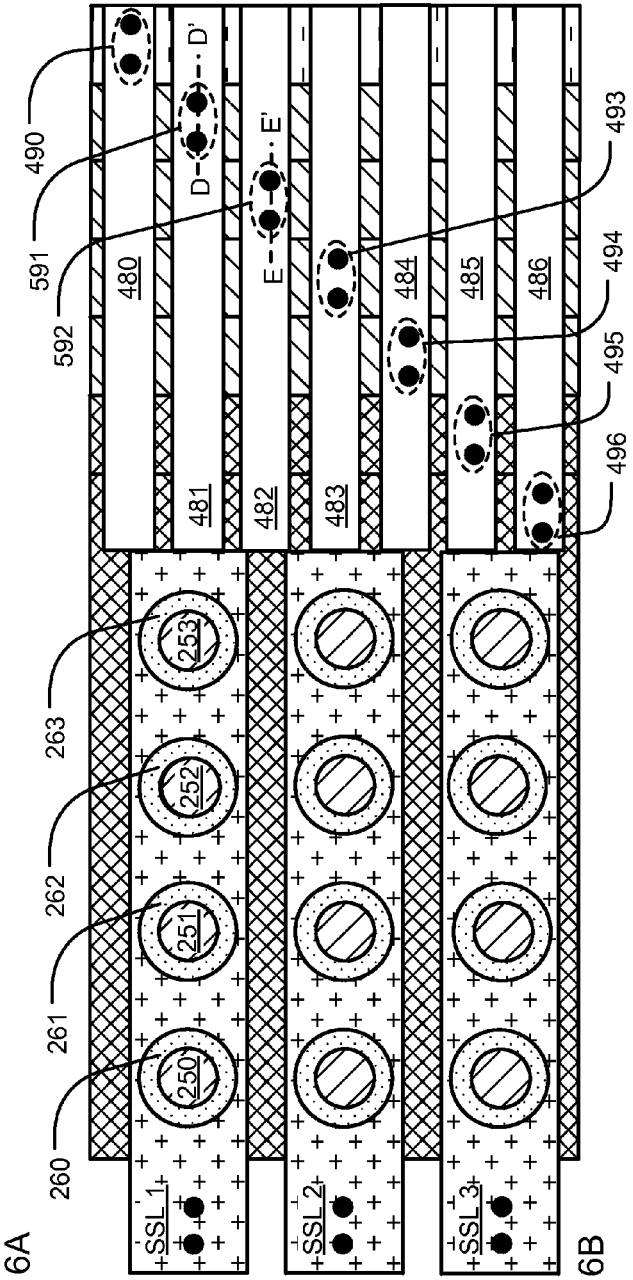
FIG. 6A
FIG. 6B

WORD LINE REPAIR FOR 3D VERTICAL CHANNEL MEMORY

BACKGROUND

1. Field of the Invention

The present invention relates to high density memory devices, and particularly to memory devices in which multiple planes of memory cells are arranged to provide a three-dimensional 3D array.

2. Description of Related Art 3D memory devices have been developed in a variety of configurations that include vertical channel structures. In vertical channel structures, memory cells including charge storage structures are disposed at interface regions between horizontal planes of conductive strips arranged as word lines, string select lines, and ground select lines, and vertical active strips including channels for the memory cells.

A memory device can include multiple blocks of memory cells. Each block can include multiple stacks of horizontal planes of conductive strips arranged as word lines, string select lines, and ground select lines. A defect in a word line in a block can cause the block to fail. When a block fails, it can be marked as a "bad" block and addressed to a good block so the memory device can use the good block instead of the "bad" block. One problem with this method is that a block has a relatively big area so the cost is relatively high.

It is desirable to provide a structure for three-dimensional integrated circuit memory using a vertical channel structure that can provide a word line repair system for the memory at a lower cost.

SUMMARY

A memory device includes a plurality of stacks of conductive strips alternating with insulating strips on an integrated circuit substrate. The stacks include at least a bottom plane (GSL) of conductive strips, a plurality of intermediate planes (WLs) of conductive strips, a top plane of conductive strips (SSLs), and an additional intermediate plane of conductive strips. A plurality of vertical structures is arranged orthogonally to the plurality of stacks. Memory elements are disposed in interface regions at cross-points between side surfaces of the plurality of stacks and the plurality of vertical structures. The memory device includes a stack of linking elements separated by insulating layers, and connected to conductive strips in respective intermediate planes in the plurality of intermediate planes (WLs) and to the additional intermediate plane. In one implementation, the plurality of vertical structures can be a plurality of vertical channel structures. In operation, when voltage is applied to a gate structure of a memory element via a word line (WL), a channel region in a memory cell in a vertical channel structure corresponding to the memory element beneath the gate structure is turned on.

Decoding circuitry is coupled to the plurality of intermediate planes and the additional intermediate plane, and configured to replace an intermediate plane indicated to be defective with the additional intermediate plane. The decoding circuitry can include a memory storing data that indicates whether a particular intermediate plane is defective, and logic to select the additional intermediate plane in response to the stored data.

The memory device can include a plurality of additional intermediate planes, and additional linking elements in the stack of linking elements separated by insulating layers and connected to conductive strips in respective additional intermediate planes in the plurality of additional intermediate planes. The decoding circuitry can be coupled to the plurality of additional intermediate planes, and configured to replace an intermediate plane indicated to be defective with an additional intermediate plane in the plurality of additional intermediate planes. The plurality of additional intermediate planes can disposed between the top plane of conductive strips and the plurality of intermediate planes. The plurality of additional intermediate planes can be disposed between the plurality of intermediate planes and the bottom plane of conductive strips.

The memory device can include a plurality of pairs of interlayer connectors extending from a connector surface, where each pair of interlayer connectors includes redundant first and second connectors connected to a single linking element in the stack of linking elements. The memory device can include patterned conductor lines on top of the connector surface, connected to respective pairs of interlayer connectors, and coupled to the decoding circuitry.

The memory device can include a pair of interlayer connectors extending from a second connector surface to a linking element connected to conductive strips in the bottom plane, and a patterned conductor line on top of the second connector surface, connected to the pair of interlayer connectors, and coupled to second decoding circuitry coupled to the bottom plane.

A method for manufacturing a memory device substantially as described herein is also provided.

Other aspects and advantages of the present invention can be seen on review of the drawings, the detailed description and the claims, which follow.

BRIEF DESCRIPTION OF THE DRAWINGS

FIGS. 3A and 3B illustrate a cross-sectional view and a top view of interlayer connectors in a 3D memory device as shown in FIGS. 2A and 2B.

FIGS. 4A and 4B illustrate a cross-sectional view and a top view of improved interlayer connectors in a 3D memory device as shown in FIGS. 2A and 2B.

FIGS. 5A and 5B illustrate a cross-sectional view and a top view of improved interlayer connectors as shown in FIGS. 4A and 4B, when an open type failure occurs.

FIGS. 6A and 6B illustrate a cross-sectional view and a top view of improved interlayer connectors as shown in FIGS. 4A and 4B, when a short type failure occurs.

DETAILED DESCRIPTION

Figure 1:
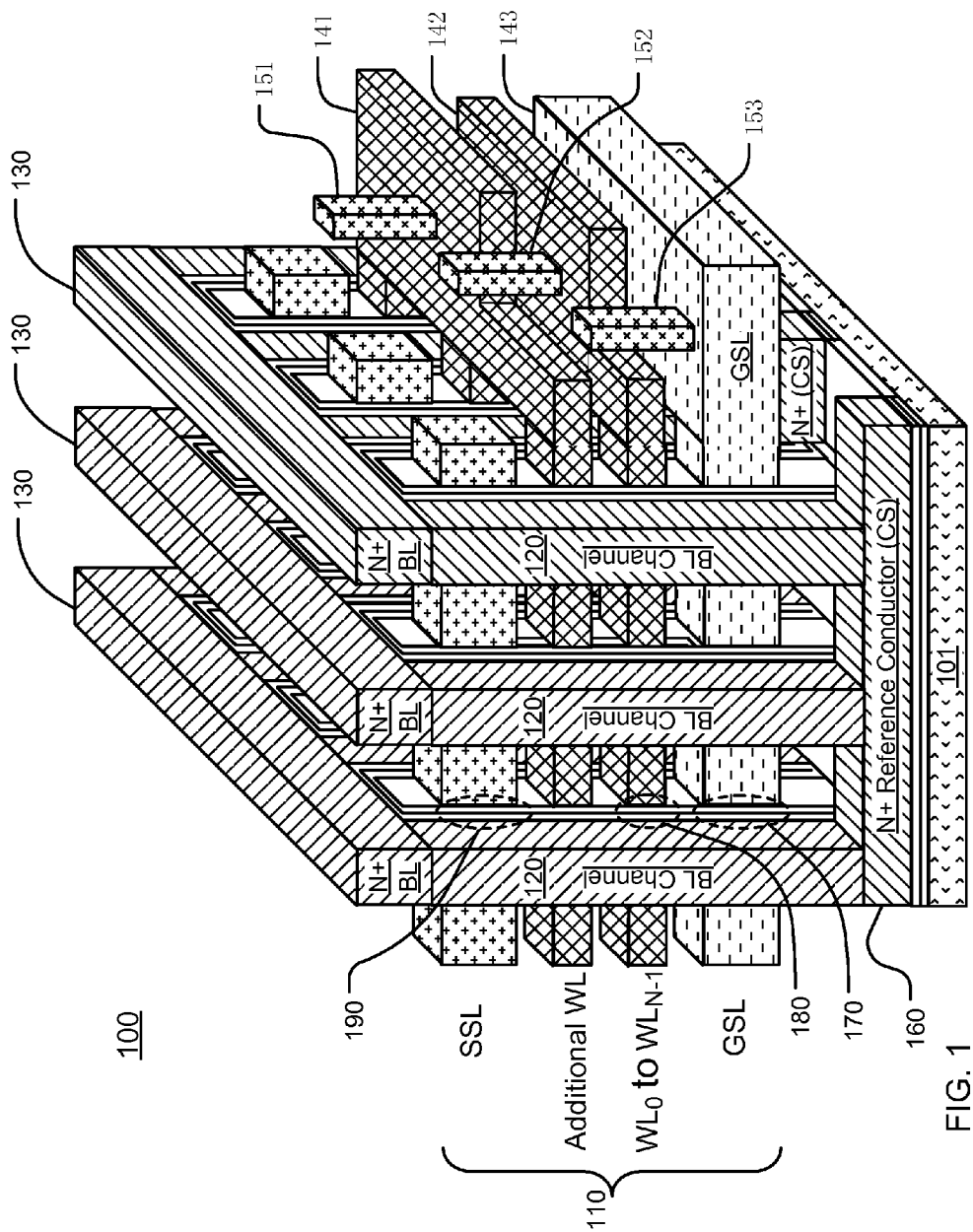
FIG. 1 is a schematic diagram of a three-dimensional (3D) memory device using a vertical channel structure having an additional intermediate word line plane.

A detailed description of embodiments of the present invention is provided with reference to the Figures. It is to be understood that there is no intention to limit the invention to the specifically disclosed structural embodiments and methods but that the invention may be practiced using other features, elements, methods and embodiments. Preferred embodiments are described to illustrate the present invention, not to limit its scope, which is defined by the claims.

Those of ordinary skill in the art will recognize a variety of equivalent variations on the description that follows. Like elements in various embodiments are commonly referred to with like reference numerals.

FIG. 1 is a schematic diagram of a three-dimensional (3D) memory device 100 using a vertical channel structure having an additional intermediate word line plane. The memory device 100 includes an array of NAND strings of memory cells, and can be a double-gate vertical channel memory array (DGVC). The memory device 100 includes an integrated circuit substrate, and a plurality of stacks of conductive strips separated by insulating material, including at least a bottom plane of conductive strips (GSL), a plurality of intermediate planes of conductive strips (WLs), a top plane of conductive strips (SSLs), and an additional intermediate plane. In the example shown in FIG. 1, a stack 110 includes a bottom plane of conductive strips (GSL), a plurality of intermediate planes of conductive strips (WLs) ranging from $WL_0$ to $WL_{N-1}$, a top plane of conductive strips (SSLs), and an additional intermediate plane (additional WL), where N can be 8, 16, 32, 64 and so on.

A plurality of vertical channel structures is arranged orthogonally over, and have surfaces conformal with, the plurality of stacks, including inter-stack vertical channel structures 120 between the stacks, and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In the example shown in FIG. 1, the linking elements 130 of the vertical channel structures can include N+ doped semiconductor material. The inter-stack vertical channel structures 120 can include lightly doped semiconductor material. The memory device includes an overlying patterned conductive layer (not shown) connected to the plurality of vertical channel structures, including a plurality of global bit lines coupled to sensing circuits.

The memory device includes charge storage structures in interface regions at cross-points 180 between side surfaces of the conductive strips in the plurality of intermediate planes (WLs) in the stacks and the inter-stack vertical channel structures 120. In the illustrated example, the memory cells in the cross-points 180 are configured in vertical, dual-gate NAND strings, where the conductive strips on both sides of a single inter-stack vertical channel structure behave as dual-gates, and can be operated cooperatively for read, erase and program operations. In other embodiments, so called gate all around structures can be used, in which the vertical channel structures pass through horizontal strips which surround the memory layers at the corresponding frustums of the vertical channel structures. A reference conductor 160 is disposed between the bottom plane (GSL) of conductive strips and the integrated circuit substrate (not shown).

The memory device includes string select switches 190 at interface regions with the top plane of conductive strips, and reference select switches 170 at interface regions with the bottom plane (GSL) of conductive strips. The dielectric layers of the charge storage structure can act as gate dielectric layers for the switches 170, 190 in some examples.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

The memory device 100 includes linking elements that include landing areas in the conductive strips for the horizontal word line and GSL line structures, configured for staircase contacts to overlying decoding circuits. String selection lines in the top plane of conductive strips are independently coupled to and controlled by the string selection line decoding circuits.

Conductive strips in the plurality of intermediate planes (WLs) and the additional intermediate plane, and conductive strips in the bottom plane (GSL) are connected together to reduce decoder areas and consequently the overall size of the memory device. Conductive strips in the top plane (SSL) are individually decoded to allow correct bit line decoding.

The memory device can include linking elements, such as linking elements 141 and 142, that provide landing areas connecting sets of word lines in the intermediate planes (WL) and the additional intermediate plane, and interlayer connectors, such as interlayer connectors 151 and 152, coupled to landing areas in the linking elements 141 and 142, where the linking elements include openings through which interlayer connectors coupled to landing areas in lower intermediate planes extend. The landing areas are at interface regions between bottom surfaces of the interlayer connectors and top surfaces of the linking elements.

As illustrated in FIG. 1, the linking element 141 provides a landing area connecting a set of word lines in the additional intermediate plane, and the linking element 142 represents landing areas connecting sets of word lines in the plurality of intermediate planes ranging from $WL_0$ to $WL_{N-1}$.

As illustrated in FIG. 1, interlayer connectors for sets of word lines at multiple layers in the plurality of intermediate planes and the additional intermediate plane are arranged in a staircase structure. For instance, interlayer connector 151 is connected to a landing area at a level for the additional intermediate plane. Interlayer connector 152 represents one of interlayer connectors connected to landing areas at different layers in the plurality of intermediate planes ranging from $WL_0$ to $WL_{N-1}$. The staircase structure can be formed in a word line decoder region near the boundary of a region for the array of NAND strings of memory cells and a region for peripheral circuits.

In the example shown in FIG. 1, the memory device includes linking elements, such as a linking element 143, connecting sets of ground selection lines in the bottom plane (GSL) of conductive strips, and interlayer connectors, such as an interlayer connector 153, coupled to landing areas in the linking elements in the bottom plane, where the interlayer connectors extend through the openings in the linking elements in the intermediate planes (WLs). The landing areas are at interface regions between bottom surfaces of the interlayer connectors, such as an interlayer connector 153, and top surfaces of the linking elements, such as a linking element 143.

Examples of vertical channel 3D NAND memory structures are described in commonly owned, and co-pending U.S. patent application Ser. No. 14/284,306, entitled "3D Independent Double Gate Flash Memory," filed 21 May 2014 by Lue, which application is incorporated by reference as if fully set forth herein. See also, U.S. Pat. No. 8,013,383 entitled Nonvolatile Semiconductor Storage Device Including a Plurality of Memory Strings, issued 6 Sep. 2011; U.S. Patent Application Publication No. 2102/0299086 entitled Semiconductor Memory Devices, published 29 Nov. 2012; and U.S. Pat. No. 8,363,476 entitled Memory Device, Manufacturing Method and Operating Method of the Same, issued 20 Jan. 2013, all of which are incorporated by reference as if fully set forth herein. As can be seen from the just cited representative references, a variety of configurations for the word line planes in vertical channel memory structures has been developed, all of which can be used in embodiments of the present technology.

Figure 2A:
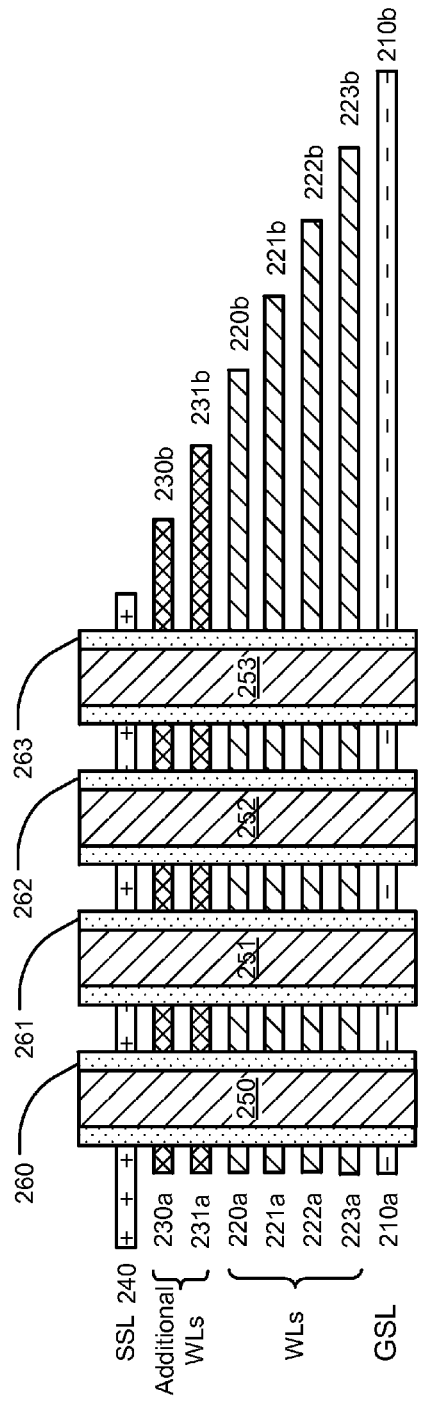
FIGS. 2A and 2B illustrate a cross-sectional view and a top view of an implementation of a 3D memory device using a vertical channel structure.
Figure 2B:
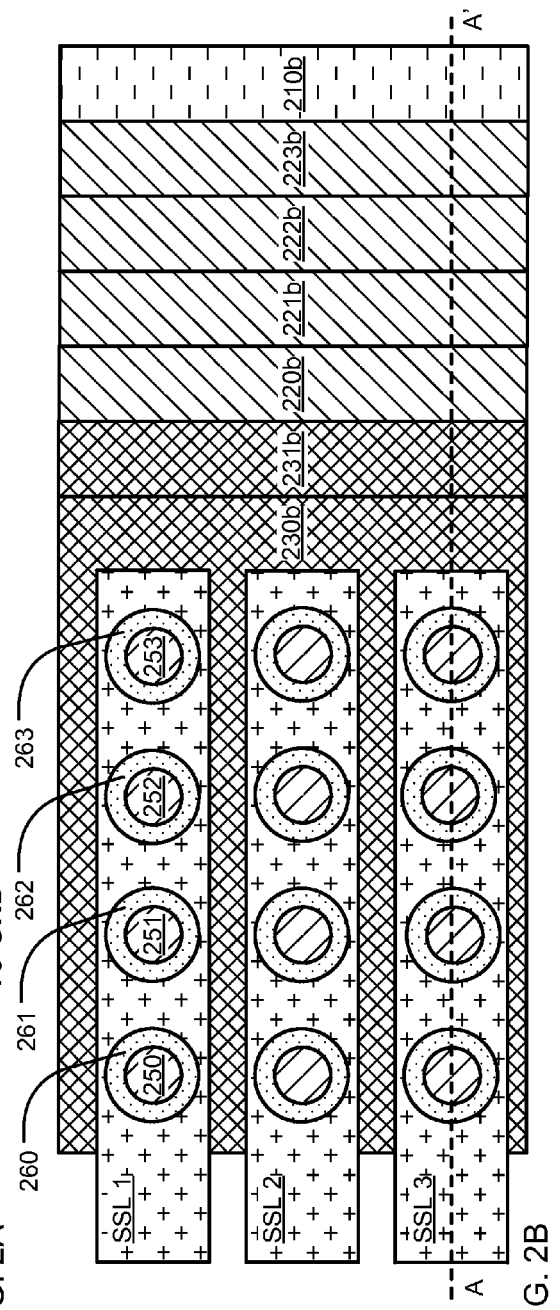

FIGS. 2A and 2B illustrate a cross-sectional view and a top view of an implementation of a 3D memory device using a vertical channel structure. The memory device includes a plurality of stacks of conductive strips alternating with insulating strips on an integrated circuit substrate. The stacks include at least a bottom plane of conductive strips used as a ground select line (GSL), a plurality of intermediate planes of conductive strips used as word lines (WLs), a top plane of conductive strips used as string select lines (SSLs), and an additional intermediate plane of conductive strips used as additional word lines.

FIG. 2A is a cross-sectional view of the memory device, taken at A-A' of FIG. 2B, showing a bottom plane 210a (GSL), a plurality of intermediate planes 220a-223a (WLs), additional intermediate planes 230a and 231a, and a top plane 240 (SSL). Although the additional intermediate planes are shown as disposed between the top plane and the plurality of intermediate planes, the additional intermediate planes can be disposed between the plurality of intermediate planes and the bottom plane. Although only 4 planes are shown for the plurality of intermediate planes, the plurality of intermediate planes can include more intermediate planes, such as 8, 16, 32, 64, 128 intermediate planes.

A plurality of vertical channel structures (e.g. 250-253) is arranged orthogonally to the plurality of stacks and through the conductive strips in the stacks. Memory elements (e.g. 260-263) are disposed in interface regions at cross-points between side surfaces of the plurality of stacks and the plurality of vertical channel structures.

The memory device includes a stack of linking elements separated by insulating layers, and connected to conductive strips in respective planes in the plurality of stacks. As illustrated in the example of FIG. 2A, a linking element 210b is connected to conductive strips in the bottom plane 210a (GSL), linking elements 220b-223b are connected to conductive strips in intermediate planes 220a-223a (WLs), additional linking elements 230b-231b are connected to conductive strips in additional intermediate planes 230a-231a Linking elements can be patterned at the same time as conductive strips in respective planes are patterned.

FIG. 2B is a top view of the memory device, showing the top plane 240 (SSL) including conductive strips SSL1, SSL2 and SSL3, additional linking elements 230b-231b connected to conductive strips in additional intermediate planes, linking elements 220b-223b connected to conductive strips in the plurality of intermediate planes (WLs), and linking element 210b connected to conductive strips in the bottom plane (GSL). Vertical channel structures (e.g. 250-253) and memory elements (e.g. 260-263) are shown through the conductive strips SSL1, SSL2 and SSL3 in the top plane.

Decoding circuitry (e.g. 840, FIG. 8) is coupled to the plurality of intermediate planes (e.g. 220a-223a) and the additional intermediate plane (e.g. 230a, 231a), and configured to replace an intermediate plane indicated to be defective with the additional intermediate plane. The decoding circuitry includes a memory storing data that indicates whether a particular intermediate plane is defective, and logic to select the additional intermediate plane in response to the stored data. The memory can comprise one-time programmable memory elements or fuses, that can be written with defective intermediate plane indications during device testing, for example.

The memory device can include blocks of stacks of conductive strips, where each block includes at least a bottom plane (GSL) of conductive strips, a plurality of intermediate planes (WLs) of conductive strips, a top plane of conductive strips (SSLs), and an additional intermediate plane of conductive strips. The decoding circuitry can be configured to replace an intermediate plane indicated to be defective in a particular block with the additional intermediate plane in the particular block, without replacing a corresponding intermediate plane in another block that is not indicated to be defective. A more complex decoding circuitry as such can improve the strength of the word line repair system as described herein.

Vertical channel structures (e.g. 250-253) can comprise semiconductor materials adapted to act as channels for the memory elements, such materials as Si, Ge, SiGE, GaAs, SiC, and Graphene. Memory elements in the memory device can include charge storage structures, such as multilayer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

FIGS. 3A and 3B illustrate a cross-sectional view and a top view of interlayer connectors in a 3D memory device using a vertical channel structure as shown in FIGS. 2A and 2B. The memory device can include a plurality of interlayer connectors (e.g. 391-396) extending from a connector surface (e.g. 370), where an interlayer connector is connected to a respective linking element in the stack of linking elements. The memory device can include patterned conductor lines (e.g. 381-386) on top of the connector surface, connected to respective interlayer connectors, and coupled to word line decoding circuitry (e.g. 840, FIG. 8).

FIG. 3A is a cross-sectional view of the memory device, taken at B-B' of FIG. 3B, showing interlayer connector 391 extending from the connector surface 370 towards the respective linking element 223b, but failing to connect to the respective linking element 223b, due to a manufacturing problem. In other words, there is an "open" type failure. Consequently, there is no gate bias for memory elements (e.g. 250a-253a) in interface regions at cross-points between a conductive strip in the intermediate plane 223a, and the plurality of vertical channel structures (e.g. 250-253), where the intermediate plane 223a is connected to the respective linking element 223b. Use of an additional intermediate plane (e.g. 230b, 231b) as described in connection with FIG. 2A-2B cannot address the "open" type failure, because channels are in series through each vertical channel structure. An indeterminate voltage on the word lines of the "open" intermediate plane can interfere with operation of the NAND strings.

As illustrated in the example of FIGS. 3A and 3B, the memory device can also include an interlayer connectors (e.g. 390) extending from a second connector surface to a linking element (e.g. 210b) connected to conductive strips in the bottom plane (e.g. 210a), and a patterned conductor line (e.g. 380) on top of the second connector surface, connected to the interlayer connector (e.g. 390), and coupled to second decoding circuitry coupled to the bottom plane (not shown).

FIGS. 4A and 4B illustrate a cross-sectional view and a top view of improved interlayer connectors in a 3D memory device using a vertical channel structure as shown in FIGS. 2A and 2B. The memory device can include a plurality of pairs of interlayer connectors (e.g. 491-496) extending from a connector surface (e.g. 470), where each pair of interlayer connectors is connected to a respective linking element in the stack of linking elements. The memory device can include patterned conductor lines (e.g. 481-486) on top of the connector surface, connected to respective pairs of interlayer connectors, and coupled to word line decoding circuitry (e.g. 840, FIG. 8).

FIG. 4A is a cross-sectional view of the memory device, taken at B-B' of FIG. 4B, showing a pair of interlayer connectors 491 extending from the connector surface 470, where the pair of interlayer connectors is connected to a respective linking element in the stack of linking elements (e.g. 223b). A patterned conductor line (e.g. 481) on top of the connector surface (e.g. 470) is connected to the respective pair of interlayer connectors (e.g. 491) including redundant first and second interlayer connectors, and coupled to word line decoding circuitry (e.g. 840, FIG. 8).

As illustrated in the example of FIGS. 4A and 4B, the memory device can also include a pair of interlayer connectors (e.g. 490) extending from a second connector surface (e.g. 471) to a linking element (e.g. 210b) connected to conductive strips in the bottom plane (e.g. 210a), and a patterned conductor line (e.g. 480) on top of the second connector surface, connected to the pair of interlayer connectors, and coupled to second decoding circuitry coupled to the bottom plane (not shown).

If the open type failure rate for one interlayer connector to fail is $10^{-3}$, then the open type failure rate for both interlayer connectors in a pair to fail is $10^{-3} \times 10^{-3} = 10^{-6}$. If the open type failure rate for one interlayer connector to fail is represented by p where p<1, then the open type failure rate for n interlayer connectors connected to a linking element to fail is $p^n$, which is much less than p ($p^n \ll p$). Thus the open type failure rate is significantly reduced by the redundancy provided using the present technology.

FIGS. 5A and 5B illustrate a cross-sectional view and a top view of improved interlayer connectors as shown in FIGS. 4A and 4B, when an open type failure occurs. FIG. 5A is a cross-sectional view of the memory device, taken at B-B' of FIG. 5B, showing a pair of interlayer connectors 591 extending from the connector surface 470, where one of the interlayer connectors in the pair is connected to a respective linking element in the stack of linking elements (e.g. 223b), while an open type failure occurs for the other interlayer connectors in the pair.

FIGS. 6A and 6B illustrate a cross-sectional view and a top view of improved interlayer connectors as shown in FIGS. 4A and 4B, when a short type failure occurs. FIG. 6A shows a cross-sectional view of the memory device, taken at D-D' of FIG. 6B, showing a pair of interlayer connectors 591 extending from the connector surface 470, and connected to a respective linking element in the stack of linking elements (e.g. 223b). A patterned conductor line (e.g. 481) on top of the connector surface (e.g. 470) is connected to the pair of interlayer connectors 591, and is coupled to word line decoding circuitry (e.g. 840, FIG. 8).

FIG. 6A also shows a cross-sectional view of the memory device, taken at E-E' of FIG. 6B, showing a pair of interlayer connectors 592 extending from the connector surface 470, and connected to a respective linking element in the stack of linking elements (e.g. 222b). However, one of the interlayer connectors in the pair 592 is shorted to another linking element 223b, causing a short type failure.

When a pair of interlayer connectors is used instead of a single interlayer connector to connect a patterned conductor line to a respective linking element, the short type failure rate doubles. However, when a short type failure occurs, the failure can be addressed by the word line decoding circuitry coupled to the plurality of intermediate planes and the plurality of additional intermediate planes. In particular, the word line decoding circuitry can replace a pair of intermediate planes (e.g. 222b, 223b) connected to the pair of interlayer connectors that has at least one short type failure (e.g. 592) with a pair of additional intermediate planes (e.g. 230b, 231b). The shorted planes can still be biased for operation as unselected planes, supporting operation of the NAND strings in the block. In embodiments supporting redundancy for shorted planes, the decoder circuitry can be configured to identify both the replacement word line planes and the failed planes, and to bias the shorted planes as "unselected" during programming and reading operations while biasing the replacement plane as "selected" or as "unselected" according to the address of the read or program operation.

Figure 7:
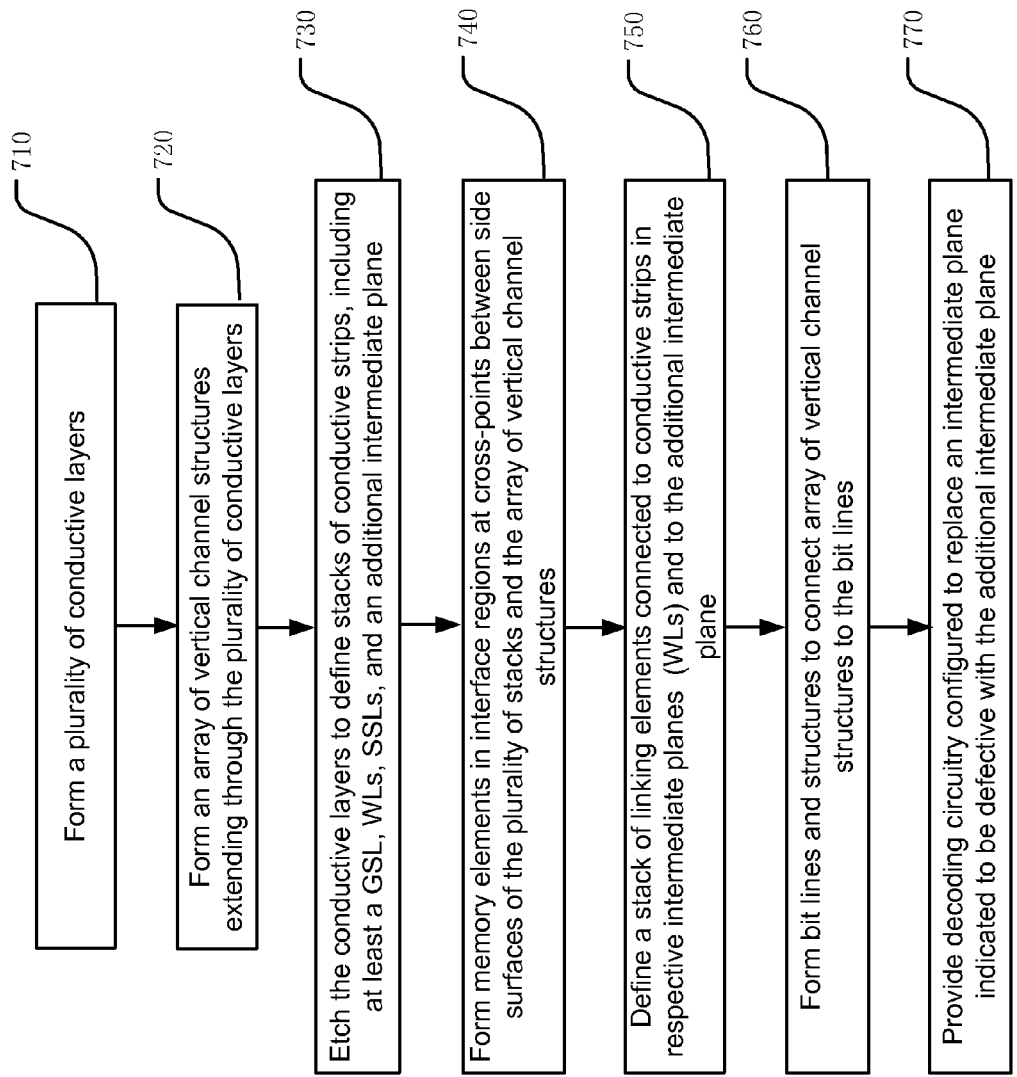
FIG. 7 is a flow chart illustrating a method for manufacturing a 3D memory device according to one embodiment.

FIG. 7 is a flow chart illustrating a method for manufacturing a 3D memory device according to one embodiment. A plurality of conductive layers alternating with insulating layers is formed on a substrate (Step 710). An array of vertical channel structures is formed extending through the plurality of conductive layers (Step 720). The plurality of conductive layers is etched to define a plurality of stacks of conductive strips alternating with insulating strips, including at least a bottom plane (GSL) of conductive strips, a plurality of intermediate planes (WLs) of conductive strips, a top plane of conductive strips (SSLs), and an additional intermediate plane of conductive strips (Step 730).

The additional intermediate plane of conductive strips can be disposed between the top plane of conductive strips and the plurality of intermediate planes. The additional intermediate plane of conductive strips can be disposed between the plurality of intermediate planes and the bottom plane of conductive strips. More than one additional intermediate plane of conductive strips, or a plurality of additional intermediate planes can be defined at Step 730.

Memory elements are formed in interface regions at cross-points between side surfaces of the plurality of stacks and the array of vertical channel structures (Step 740). A stack of linking elements separated by insulating layers is defined, connected to conductive strips in respective intermediate planes in the plurality of intermediate planes (WLs) and to the additional intermediate plane (Step 750). Step 750 can be performed at the same time as Step 730 is performed.

The plurality of stacks of conductive strips can be configured as blocks of stacks of conductive strips, where conductive strips in respective blocks etched from the plurality of intermediate planes are connected to linking elements for the respective blocks. Conductive strips in respective blocks etched from the additional intermediate plane are connected to linking elements for the respective blocks.

Bit lines and structures can be formed to connect the array of vertical channel structures to the bit lines (Step 760). Decoding circuitry is provided and coupled to the plurality of intermediate planes (WLs) and the additional intermediate plane. The decoding circuitry is configured to replace an intermediate plane indicated to be defective with the additional intermediate plane (Step 770). The decoding circuitry can include a memory storing data that indicates whether a particular intermediate plane is defective, and logic to select the additional intermediate plane in response to the data during operations that use addresses that identify, or that would apply bias arrangements to, the defective plane.

A plurality of pairs of interlayer connectors can be formed (e.g. 491, FIG. 4A), extending from a connector surface, where each pair of interlayer connectors includes redundant first and second interlayer connectors connected to a single linking element in the stack of linking elements. Patterned conductor lines can be formed on top of the connector surface, connected to respective pairs of interlayer connectors, and coupled to the decoding circuitry.

A pair of interlayer connectors can be formed (e.g. 490, FIG. 4A), extending from a second connector surface to a linking element connected to conductive strips in the bottom plane (GSL). A patterned conductor lines can be formed on top of the second connector surface, connected to the pair of interlayer connectors, and coupled to the second decoding circuitry coupled to the bottom plane.

Figure 8:
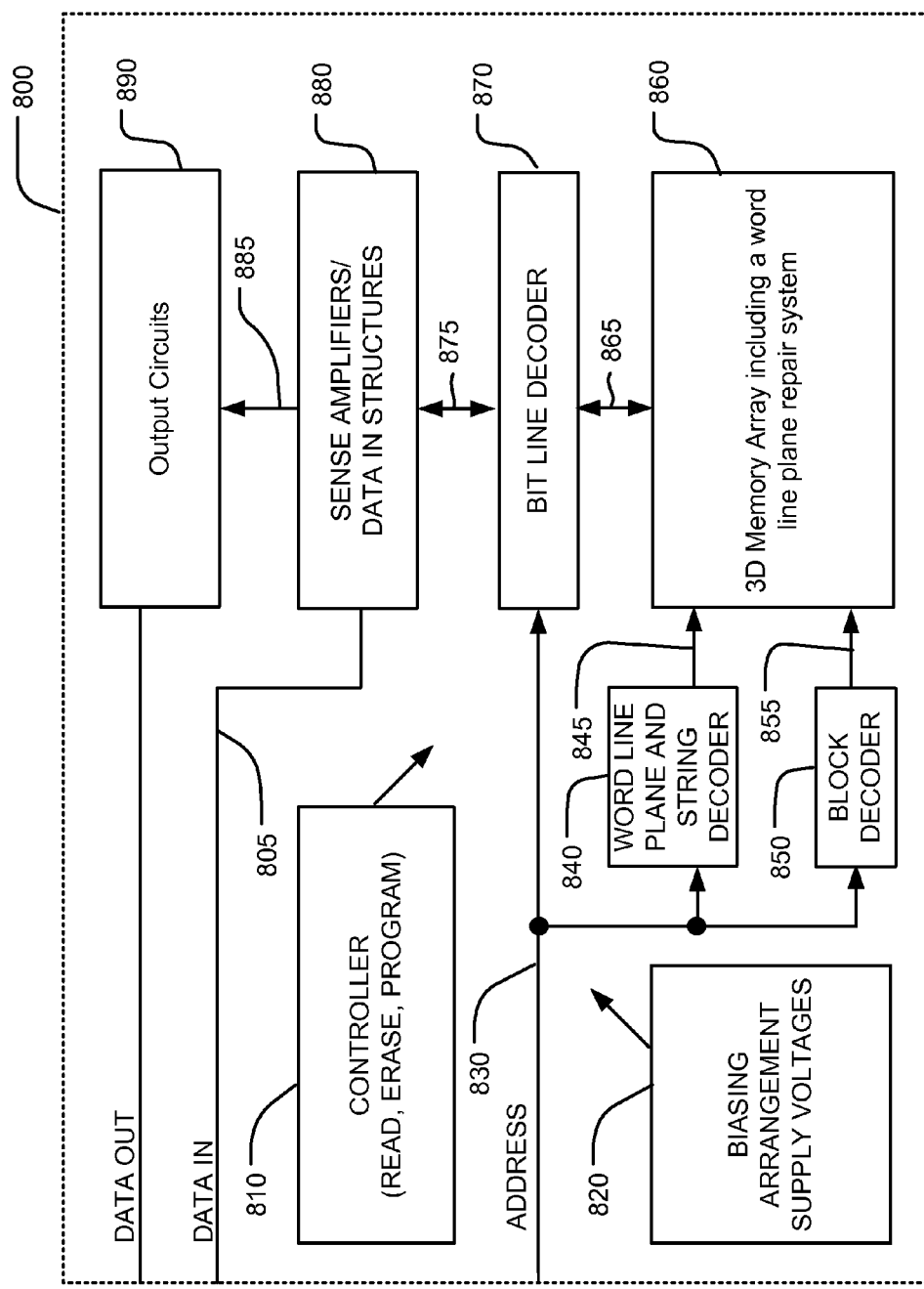
FIG. 8 is a simplified chip block diagram of an integrated circuit memory according to an embodiment.

FIG. 8 is a simplified block diagram of an integrated circuit memory device according to an embodiment. The integrated circuit 800 includes a 3D memory array 860 on an integrated circuit substrate. The memory array 860 includes a word line repair system substantially as described herein.

A word line plane and string decoder 840 is coupled to a plurality of word line planes, and the string select and ground select planes 845 in the memory array 860. A bit line decoder 870 is coupled to a plurality of bit lines 865 in the memory array 860 for reading and programming data from the memory cells in the memory array 860. A block decoder 850 is coupled to a plurality of blocks in the memory array 860 on bus 855. Addresses are supplied on bus 830 to decoder 870, decoder 840 and decoder 850. Sense amplifiers and data-in structures in block 880 are coupled to the bit line decoder 870, in this example via data bus 875. Sensed data from the sense amplifiers are supplied via output data lines 885 to output circuits 890. Output circuits 890 drive the sensed data to destinations external to the integrated circuit 800. Input data is supplied via the data-in line 805 from input/output ports on the integrated circuit 800 or from other data sources internal or external to the integrated circuit 800, such as a general purpose processor or special purpose application circuitry, or a combination of modules providing system-on-a-chip functionality supported by the 3D memory array 860, to the data-in structures in block 880.

In the example shown in FIG. 8, a controller 810 using a bias arrangement state machine controls the application of bias arrangement supply voltage generated or provided through the voltage supply or supplies in block 820, such as read and program voltages. The controller 810 can include modes of operation for multi-level cell (MLC) programming and reading. The controller 810 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The integrated circuit 800 can support redundancy for shorted planes. The memory array 860 can include replacement word line planes for replacing failed word line plane. The word line plane and string decoder 840 can include a memory storing data that indicates whether a particular word line plane is defective, and logic to select a replacement word line plane in response to the data. The word line plane and string decoder 840 can be configured to identify both the replacement word line planes and the failed planes, and to bias the shorted planes as "unselected" during programming and reading operations while biasing the replacement plane as "selected" or as "unselected" according to the address of the read or program operation. Alternatively, the controller 810 can be configured to include a memory storing data that indicates whether a particular word line plane is defective, and logic to select a replacement word line plane in response to the data.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a plurality of stacks of conductive strips alternating with insulating strips, including at least a bottom plane of conductive strips, a plurality of intermediate planes of conductive strips, and a top plane of conductive strips;
   a plurality of vertical structures arranged orthogonally to the plurality of stacks;
   memory elements in interface regions at cross-points between side surfaces of the plurality of stacks and the plurality of vertical structures;
   a stack of linking elements separated by insulating layers, and connected to conductive strips in respective intermediate planes in the plurality of intermediate planes;
   a plurality of pairs of interlayer connectors extending from a connector surface, wherein each pair of interlayer connectors includes first and second interlayer connectors connected to a single linking element in the stack of linking elements; and
   decoding circuitry coupled to the plurality of intermediate planes, and configured to address a respective conductive strip connected to the single linking element via the first and second interlayer connectors in the pair of interlayer connectors.

2. The memory device of claim 1, wherein:
   the plurality of stacks of conductive strips includes a plurality of additional intermediate planes of conductive strips; and
   the decoding circuitry is configured to replace a pair of intermediate planes in the plurality of intermediate planes with a pair of additional intermediate planes in the plurality of additional intermediate planes.

3. The memory device of claim 2, wherein one of the first and second interlayer connectors in the pair of interlayer connectors is connected to a single linking element connected to a conductive strip in an intermediate plane in the pair of intermediate planes, and connected to another single linking element connected to another conductive strip in another intermediate plane in the pair of intermediate planes.

4. The memory device of claim 2, the stack of linking elements connected to conductive strips in respective additional intermediate planes in the plurality of additional intermediate planes.

5. The memory device of claim 2, wherein the decoding circuitry includes a memory storing data that indicates whether a particular pair of intermediate planes is replaced, and logic to select the pair of additional intermediate planes in response to said data.

6. The memory device of claim 2, comprising:
a controller configured to bias the replaced pair of intermediate planes as unselected planes during programming and reading operations.

7. The memory device of claim 2, wherein the plurality of additional intermediate planes is disposed between the top plane of conductive strips and the plurality of intermediate planes.

8. The memory device of claim 2, wherein the plurality of additional intermediate planes is disposed between the plurality of intermediate planes and the bottom plane of conductive strips.

9. The memory device of claim 1, comprising:
patterned conductor lines on top of the connector surface, connected to respective pairs of interlayer connectors, and coupled to the decoding circuitry.

10. The memory device of claim 1, comprising:
bit lines and structures to connect the array of vertical structures to the bit lines.

* * * * *